(12) United States Patent
Kim et al.

(10) Patent No.: US 7,872,415 B2
(45) Date of Patent: Jan. 18, 2011

(54) ORGANIC LIGHT EMITTING DISPLAY

(75) Inventors: Chang Nam Kim, Seoul (KR); Sang Kyoon Kim, Hanam-si (KR); Seong Joong Kim, Anyang-si (KR); Hong Gyu Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 802 days.

(21) Appl. No.: 11/723,373

(22) Filed: Mar. 19, 2007

(65) Prior Publication Data

US 2007/0216296 A1    Sep. 20, 2007

(30) Foreign Application Priority Data

Mar. 20, 2006   (KR) ................. 10-2006-0025472

(51) Int. Cl.
*H01J 1/62* (2006.01)
*H01J 63/04* (2006.01)

(52) U.S. Cl. .................. 313/506; 313/505; 313/512

(58) Field of Classification Search ......... 313/495–512; 315/169.3, 169.4; 257/40, 79; 428/690; 345/30, 36, 44, 45
See application file for complete search history.

(56) References Cited

U.S. PATENT DOCUMENTS

2005/0045891 A1*  3/2005  Yamazaki et al. ............. 257/72
2005/0087769 A1*  4/2005  Yamazaki et al. ........... 257/202

* cited by examiner

*Primary Examiner*—Bumsuk Won
*Assistant Examiner*—Elmito Breval
(74) *Attorney, Agent, or Firm*—Morgan Lewis & Bockius LLP

(57) ABSTRACT

An organic light emitting display is disclosed. The organic light emitting display includes a substrate, a thin film transistor positioned on the substrate, a planarization layer positioned on the thin film transistor, an emission unit, and a passivation layer. The emission unit is positioned on the planarization layer and electrically connected to the thin film transistor. The passivation layer is positioned on the substrate to cover an edge portion of the planarization layer.

16 Claims, 3 Drawing Sheets

ORGANIC LIGHT EMITTING DISPLAY

This application claims priority to and the benefit of Korea Patent Application No. 10-2006-0025472, filed on Mar. 20, 2006, the entire content of which is incorporated herein by reference.

BACKGROUND

1. Field

This document relates to an organic light emitting display.

2. Related Art

In general, an organic light emitting display is a self-emitting display for emitting light due to an electrical excitation of a fluorescent compound. Since the organic light emitting display is driven at a low voltage, is manufactured to be thin, and has a wide viewing angle, a fast response speed, etc., the organic light emitting display has been considered as a next generation display.

The organic light emitting display includes an organic emitting layer between an anode and a cathode. The organic light emitting display forms an exciton, which is a hole-electron pair, by recombining a hole received from the anode and an electron received from the cathode within the organic emitting layer, and emits light by energy generated when the exciton returns to a ground level. The organic light emitting display further includes a hole (electron) injecting layer and/or a hole (electron) transporting layer between the anode or the cathode and the organic emitting layer.

FIG. 1 illustrates a related art organic light emitting display.

Referring to FIG. 1, in an organic light emitting display 100, a thin film transistor 130 is positioned on a substrate 110, and a planarization layer 150 is positioned on the thin film transistor 130.

The thin film transistor 130 includes a semiconductor layer 133, a gate dielectric layer 132, a gate electrode 131, an interlayer dielectric layer 134, a source electrode 135, and a drain electrode 136.

An emission unit 140 is positioned on the planarization layer 150 to be electrically connected to the thin film transistor 130. The emission unit 140 includes a first electrode 141 electrically connected to the drain electrode 136, an organic emitting layer 143, and a second electrode 144.

A dielectric layer 142 is positioned on the first electrode 141 to expose a portion of the first electrode 141. The organic emitting layer 143 is positioned on the exposed portion of the first electrode 141.

A passivation layer 160 is positioned to cover the emission unit 140. An edge portion of the substrate 110 including the passivation layer 160 is attached to a cover substrate 120 with a sealant 170.

FIG. 2 illustrates another example of a related art organic light emitting display.

Referring to FIG. 2, in an organic light emitting display 200, a thin film transistor 230 including a semiconductor layer 233, a gate dielectric layer 232, a gate electrode 231, an interlayer dielectric layer 234, a source electrode 235, and a drain electrode 236 is positioned on a substrate 210. A planarization layer 250 is positioned on the thin film transistor 230.

An emission unit 240 is positioned on the planarization layer 250 to be electrically connected to the thin film transistor 230. The emission unit 240 includes a first electrode 241, a bank layer 242, an organic emitting layer 243, and a second electrode 244.

A passivation layer 260 is positioned to cover the emission unit 240. The substrate 210 including the passivation layer 260 is attached to a cover substrate 220 with a face sealant 270.

Moisture and oxygen penetrating inside the organic light emitting display may damage the organic emitting layer and the electrodes. More specifically, when moisture penetrates from the outside, the moisture reacts with the organic emitting layer and the electrodes through a pin hole formed in a portion of a cathode or an edge between the cathode and a cathode separator, thereby generating hydrogen.

Such hydrogen diffuses into the left and right sides on an interface between the cathode and the organic emitting layer, thereby causing generation of bubbles over the organic emitting layer. As a result, an event in which the cathode is lifted up occurs frequently. Also, when oxygen transmits through the pin hole of the cathode or the edge between the cathode and the cathode separator, an oxide layer is likely to be formed on the cathode at the interface between the cathode and the organic emitting layer. The oxide layer often shields a flow of current.

Referring to FIGS. 1 and 2, the edge portions of the related art organic light emitting displays 100 and 200 include the substrates 110 and 120, the planarization layers 150 and 250, the passivation layers 160 and 260, the sealants 170 and 270, and the cover substrates 120 and 220. Outside moisture and oxygen easily penetrate into the organic light emitting displays 100 and 200 through the interface between the planarization layers 150 and 250 and the passivation layers 160 and 260, thereby deteriorating the organic light emitting displays 100 and 200.

SUMMARY

In one aspect, an organic light emitting display comprises a substrate, a thin film transistor positioned on the substrate, a planarization layer positioned on the thin film transistor, an emission unit positioned on the planarization layer and electrically connected to the thin film transistor, and a passivation layer positioned on the substrate to cover an edge portion of the planarization layer.

A length ranging from an edge of the planarization layer to an edge of the passivation layer may range from 50 μm to 500 μm.

The planarization layer and the passivation layer each may have a normal taper edge portion, and taper angles of the edge portions of the planarization layer and the passivation layer may range from 15° to 60°, respectively.

The taper angle of the edge portion of the planarization layer may be substantially equal to the taper angle of the edge portion of the passivation layer.

The organic light emitting display may further comprise a cover substrate attached to the substrate, and the substrate may be attached to the cover substrate with a sealant.

The sealant may be positioned in edge portions of the substrate and the cover substrate, and spaced from the passivation layer.

The sealant may be positioned in a space between the substrate and the cover substrate to cover an edge portion of the passivation layer.

The planarization layer, the passivation layer, and the sealant each may have a normal taper edge portion, and taper angles of the edge portions of the planarization layer, the passivation layer, and the sealant may range from 15° to 60°, respectively.

The taper angles of the edge portions of the planarization layer, the passivation layer, and the sealant may be substantially equal to one another.

The cover substrate may be a transparent substrate comprising glass or plastic.

The emission unit may comprise a first electrode, an organic emitting layer, and a second electrode.

The first electrode may be an anode, and may comprise a reflective metal layer and a transparent conductive oxide layer having a high work function.

The transparent conductive oxide layer may comprise one selected from a group consisting of ITO, IZO, ICO and ZnO.

The second electrode may be a cathode, and a transflective electrode having a low work function.

The transflective electrode may comprise one selected from a group consisting of Mg, Ag, Al, Ca or alloy thereof.

The first electrode may be a cathode, and a metal having a low work function.

The second electrode may be an anode, and comprise a transparent conductive oxide layer having a high work function.

The planarization layer may comprise one of a polyacryl-based resin, a polyimide-based resin, and a benzocyclobutene (BCB)-based resin.

The passivation layer may comprise a silicon oxide layer or a silicon nitride layer.

Detailed features and advantages of the present invention will be fully described in the foregoing embodiments of the present invention and accompanying drawings.

BRIEF DESCRIPTION OF THE DRAWINGS

The accompanying drawings, which are comprised to provide a further understanding of the invention and are incorporated in and constitute a part of this specification, illustrate embodiments of the invention and together with the description serve to explain the principles of the invention. In the drawings.

DESCRIPTION OF EMBODIMENTS

Reference will now be made in detail embodiments of the invention examples of which are illustrated in the accompanying drawings.

Figure 1:
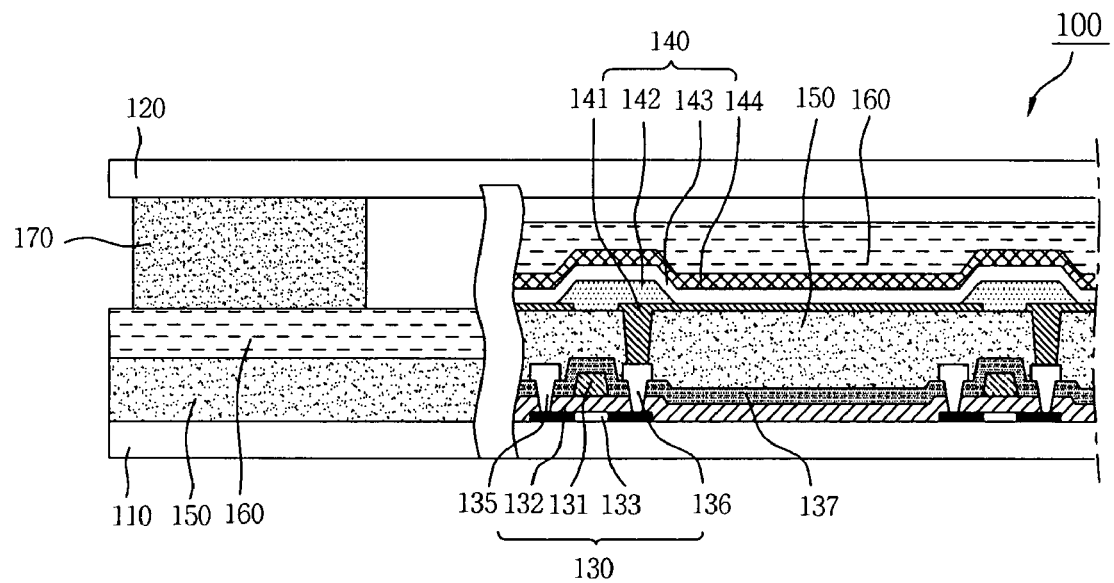
FIG. 1 illustrates a related art organic light emitting display.
Figure 2:
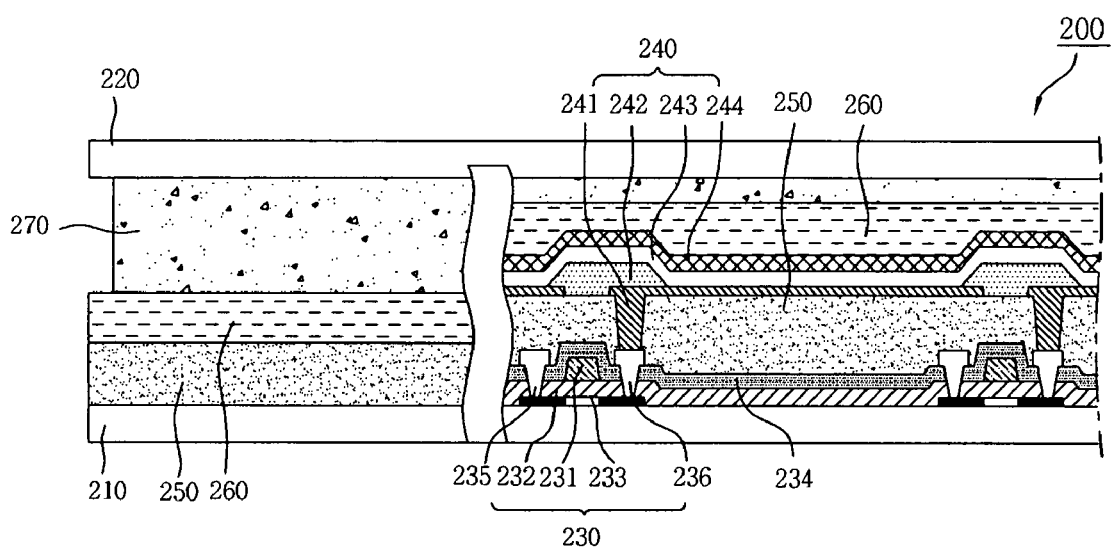
FIG. 2 illustrates another example of a related art organic light emitting display.
Figure 3:
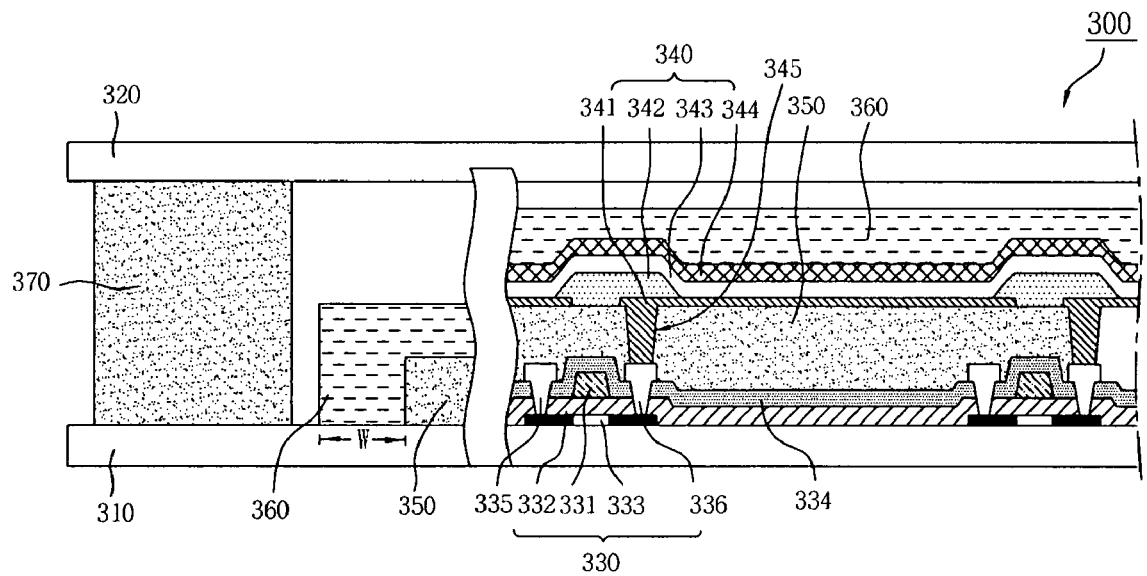
FIG. 3 illustrates an organic light emitting display according to a first embodiment.

FIG. 3 illustrates an organic light emitting display according to a first embodiment.

Referring to FIG. 3, in an organic light emitting display 300, a thin film transistor 330 and an emission unit 340 are positioned on a substrate 310.

The thin film transistor 330 may further include a switching transistor (not shown) and a capacitor (not shown).

The thin film transistor 330 includes a semiconductor layer 333, a gate dielectric layer 332, and a gate electrode 331. The semiconductor layer 333 and the gate dielectric layer 332 including the semiconductor layer 333 are positioned on the substrate 310. The gate electrode 331 is positioned on the gate dielectric layer 332 to correspond to a portion of the semiconductor layer 333.

An interlayer dielectric layer 334 is positioned on the gate electrode 331. A source electrode 335 and a drain electrode 336 are positioned on the interlayer dielectric layer 334 to be electrically connected to a portion of the semiconductor layer 333 by passing through the interlayer dielectric layer 334 and the gate dielectric layer 332.

A planarization layer 350 is positioned on the substrate 310 including the source electrode 335 and the drain electrode 336. The planarization layer 350 obviates the height difference of the substrate 310 on which the thin film transistor 330 is positioned. The planarization layer 350 includes one of a polyacryl-based resin, a polyimide-based resin, and a benzocyclobutene (BCB)-based resin. The thickness of the planarization layer 350 may range from 1 μm to 10 μm. When the thickness of the planarization layer 350 is within the above range, the height difference of the substrate 310 is efficiently obviated.

A contact hole 345 is positioned inside the planarization layer 350 to expose a portion of the drain electrode 336. The emission unit 340 is positioned on the planarization layer 350.

The emission unit 340 includes a first electrode. 341 electrically connected to the drain electrode 336 through the contact hole 345, an organic emitting layer 343, and a second electrode 344.

In a case where the organic light emitting display 300 according to the first embodiment is top-emission type, the first electrode 341 may be an anode, and include a reflective metal layer and a transparent conductive oxide layer having a high work function. The transparent conductive oxide layer may include one selected from a group consisting of ITO, IZO, ICO and ZnO. The second electrode 344 may be a cathode, and a transflective electrode including one selected from a group consisting of Mg, Ag, Al, Ca or alloy thereof.

On the other hand, the first electrode 341 may be a cathode. The first electrode 341 may include one selected from a group consisting of Mg, Ag, Al, Ca or alloy thereof. The second electrode 344 is positioned on the organic emitting layer 343. On the other hand, the second electrode 344 may be an anode, and a transparent conductive oxide layer including ITO, IZO, ICO or ZnO.

A bank layer 342 is positioned on the first electrode 341 to expose a portion of the first electrode 341. The organic emitting layer 343 is positioned on the exposed portion of the first electrode 341.

Although not shown, a hole injection layer and/or a hole transporting layer may be positioned between the first electrode 341 and the organic emitting layer 343. An electron transporting layer and/or an electron injection layer may be positioned on the organic emitting layer 343.

A passivation layer 360 is positioned on the substrate 310 to cover the emission unit 340 and the planarization layer 350. Since the planarization layer 350 is formed of an organic material, outside moisture and oxygen are likely to easily penetrate into the organic light emitting display 300 through an interface between the planarization layer 350 and the substrate 310. Therefore, the passivation layer 360 is formed to cover an edge portion of the planarization layer 350 so that the planarization layer 350 is not exposed.

The passivation layer 360 may comprise silicon nitride, silicon oxide, or multiple layers including silicon nitride and/or silicon oxide. The passivation layer 360 may be formed using sputtering or CVD (chemical vapor deposition)

A length W ranging from the edge of the planarization layer 350 to an edge of the passivation layer 360 may range from 50 μm to 500 μm. When the length W is equal to or more than 50 μm, the penetration of outside moisture and oxygen is prevented efficiently. When the length W is equal to or less than 500 μm, the passivation layer 360 are formed in bonding portions of interconnections connected to a driver for supplying a driving signal from the outside and the thin film transistor 330 such that a failure in the signal supply is prevented.

A cover substrate 320 is attached to the substrate 310 on which the passivation layer 360 is positioned. Edge portions of the substrate 310 and the cover substrate 320 are attached to each other with a sealant 370. The sealant 370 may be positioned to be spaced from the passivation layer 360. The cover substrate 320 may be a transparent substrate, and include transparent glass or plastic.

As above, the passivation layer 360 is formed to cover the edge portion of the planarization layer 350 in the first embodiment. Therefore, the penetration of outside moisture and oxygen into the organic light emitting display 300 through the interface between the planarization layer 350 including the organic material and the substrate 310 is prevented efficiently, thereby preventing the deterioration of the organic light emitting display 300 and increasing life span of the organic light emitting display 300.

Figure 4:
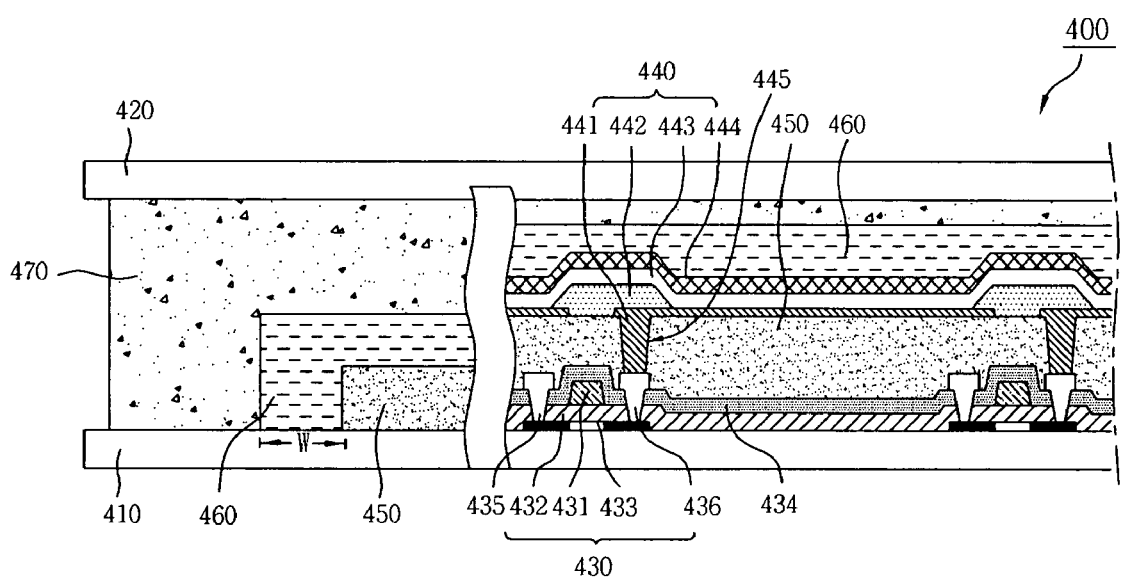
FIG. 4 illustrates an organic light emitting display according to a second embodiment.

FIG. 4 illustrates an organic light emitting display according to a second embodiment.

Referring to FIG. 4, in an organic light emitting display 400, a thin film transistor 430 and an emission unit 440 are positioned on a substrate 410.

The thin film transistor 430 including a semiconductor layer 433, a gate dielectric layer 432, a gate electrode 431, an interlayer dielectric layer 434, a source electrode 435, and a drain electrode 436 is positioned on the substrate 410.

A planarization layer 450 is positioned on the substrate 410. A contact hole 445 is positioned inside the planarization layer 450 to expose a portion of the drain electrode 436. The emission unit 440 is positioned on the planarization layer 450.

The emission unit 440 includes a first electrode 441 electrically connected to the drain electrode 436 through the contact hole 445, a bank layer 442 exposing a portion of the first electrode 441, an organic emitting layer 443 positioned on the exposed portion of the first electrode 441, and a second electrode 444.

A passivation layer 460 is positioned on the substrate 410 to cover the emission unit 440 and the planarization layer 450. Since the planarization layer 450 is formed of an organic material, outside moisture and oxygen are likely to easily penetrate into the organic light emitting display 400 through an interface between the planarization layer 450 and the substrate 410. Therefore, the passivation layer 460 is formed to cover an edge portion of the planarization layer 450 so that the planarization layer 450 is not exposed.

The passivation layer 460 may comprise silicon nitride, silicon oxide, or multiple layers including silicon nitride and/or silicon oxide. The passivation layer 460 may be formed using sputtering or CVD.

A length W ranging from the edge of the planarization layer 450 to an edge of the passivation layer 460 may range from 50 μm to 500 μm. The passivation layer 460 is formed using a shadow mask. When the length W is equal to or more than 50 μm, the penetration of outside moisture and oxygen is prevented efficiently. When the length W is equal to or less than 500 μm, the passivation layer 460 are formed in bonding portions of interconnections connected to a driver for supplying a driving signal from the outside and the thin film transistor 430 such that a failure in the signal supply is prevented.

A cover substrate 420 is attached to the substrate 410 on which the passivation layer 460 is positioned. The cover substrate 420 may be a transparent substrate, and include transparent glass or plastic.

A sealant 470 is positioned in a space between the substrate 410 and the cover substrate 420. The sealant 470 may be formed to cover the passivation layer 460. In other words, the sealant 470 is a face sealant applied to a front surface of the cover substrate 420. The space between the substrate 410 and the cover substrate 420 is filled with the sealant 470 by attaching the cover substrate 420, to which the sealant 470 is applied, to the substrate 410.

The face sealant 470 prevents line fail caused by applying pressure to the emission unit 440 due to an external impact. Since an internal space of the organic light emitting display 400 is filled with the face sealant 470, the penetration of outside moisture and oxygen into the emission unit 440 is prevented efficiently.

As above, the organic light emitting display 400 according to the second embodiment includes the passivation layer 460 covering the edge portion of the planarization layer 450, and the face sealant 470 covering the edge portion of the passivation layer 460. Therefore, the penetration of outside moisture and oxygen into the organic light emitting display 400 through the interface between the planarization layer 450 including the organic material and the substrate 410 is prevented doubly, thereby preventing the deterioration of the organic light emitting display 400 and increasing life span of the organic light emitting display 400. Further, the organic light emitting display 400 with strong durability and improved image quality is provided in the second embodiment.

Figure 5:
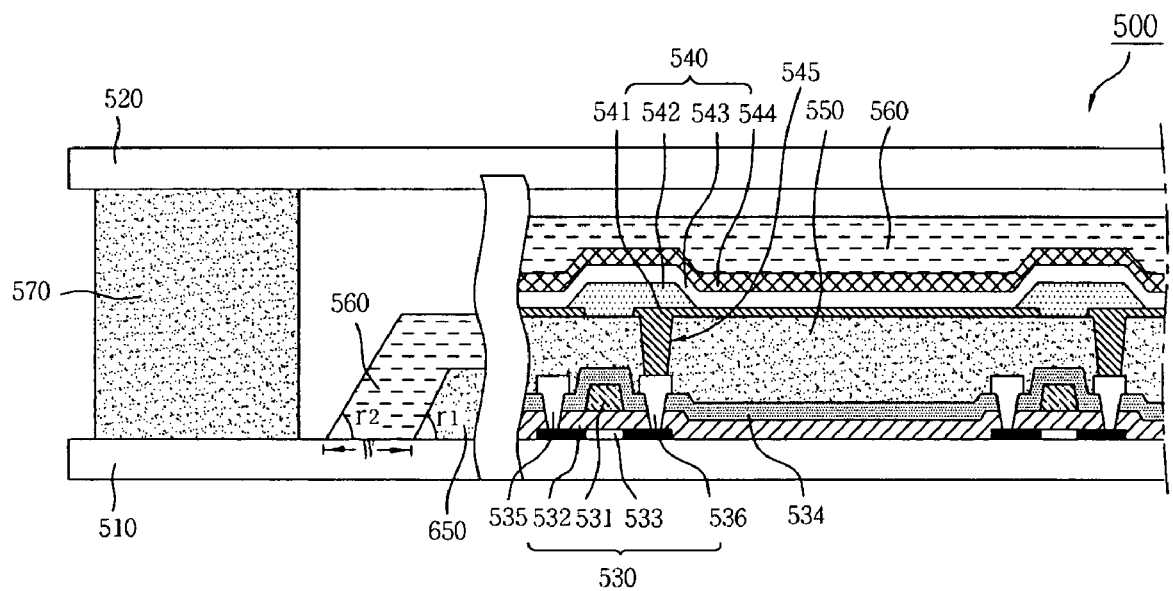
FIG. 5 illustrates an organic light emitting display according to a third embodiment.

FIG. 5 illustrates an organic light emitting display according to a third embodiment.

Referring to FIG. 5, in an organic light emitting display 500, a thin film transistor 530 and an emission unit 540 are positioned on a substrate 510.

The thin film transistor 530 including a semiconductor layer 533, a gate dielectric layer 532, a gate electrode 531, an interlayer dielectric layer 534, a source electrode 535, and a drain electrode 536 is positioned on the substrate 510.

A planarization layer 550 is positioned on the substrate 510. An edge portion of the planarization layer 550 is formed to be inclined inwardly. In other words, the planarization layer 550 includes a normal tapered edge portion. A taper angle r1 of the edge portion of the planarization layer 550 may range from 15° to 60°.

A contact hole 545 is positioned inside the planarization layer 550 to expose a portion of the drain electrode 536. The emission unit 540 is positioned on the planarization layer 550.

The emission unit 540 includes a first electrode 541 electrically connected to the drain electrode 536 through the contact hole 545, a bank layer 542 exposing a portion of the first electrode 541, an organic emitting layer 543 positioned on the exposed portion of the first electrode 541, and a second electrode 544.

A passivation layer 560 is positioned on the substrate 510 to cover the emission unit 540 and the planarization layer 550. Since the planarization layer 550 is formed of an organic material, outside moisture and oxygen are likely to easily penetrate into the organic light emitting display 500 through an interface between the planarization layer 550 and the substrate 510. Therefore, the passivation layer 560 is formed to cover an edge portion of the planarization layer 550 so that the planarization layer 550 is not exposed.

The passivation layer 560 may comprise silicon nitride, silicon oxide, or multiple layers including silicon nitride and/or silicon oxide. The passivation layer 560 may be formed using sputtering or CVD.

An edge portion of the passivation layer 560 is formed to be inclined inwardly. In other words, the passivation layer 560 includes a normal tapered edge portion. A taper angle r2 of the edge portion of the passivation layer 560 may range from 15° to 60°. The taper angle r2 of the edge portion of the passivation layer 560 may be substantially equal to the taper angle r1 of the edge portion of the planarization layer 550.

When the taper angles r1 and r2 ranges from 15° to 60°, the passivation layer 560 having an uniform thickness is formed on the planarization layer 550 due to good step coverage characteristics of the passivation layer 560. Further, since the planarization layer 550 and the passivation layer 560 are formed to be inclined, adhesion between the passivation layer 560 and the planarization layer 550 improves due to an increase in an adhesion area between the passivation layer 560 and the planarization layer 550. Accordingly, when the taper angles r2 of the passivation layer 560 is be substantially equal to the taper angle r1 of the planarization layer 550, an interception effect of moisture and oxygen penetrating from the outside is maximized.

A length W ranging from the edge of the planarization layer 550 to an edge of the passivation layer 560 may range from 50 μm to 500 μm. When the length W is equal to or more than 50 μm, the penetration of outside moisture and oxygen is prevented efficiently. When the length W is equal to or less than 500 μm, the passivation layer 560 are formed in bonding portions of interconnections connected to a driver for supplying a driving signal from the outside and the thin film transistor 530 such that a failure in the signal supply is prevented.

A cover substrate 520 is attached to the substrate 510 on which the passivation layer 560 is positioned. Edge portions of the substrate 510 and the cover substrate 520 are attached to each other with a sealant 570. The sealant 570 may be positioned to be spaced from the passivation layer 560. The cover substrate 520 may be a transparent substrate, and include transparent glass or plastic.

As above, the passivation layer 560 is formed to cover the edge portion of the planarization layer 550 in the third embodiment. Therefore, the penetration of outside moisture and oxygen into the organic light emitting display 500 through the interface between the planarization layer 550 including the organic material and the substrate 510 is prevented efficiently, thereby preventing the deterioration of the organic light emitting display 500 and increasing life span of the organic light emitting display 500.

Figure 6:
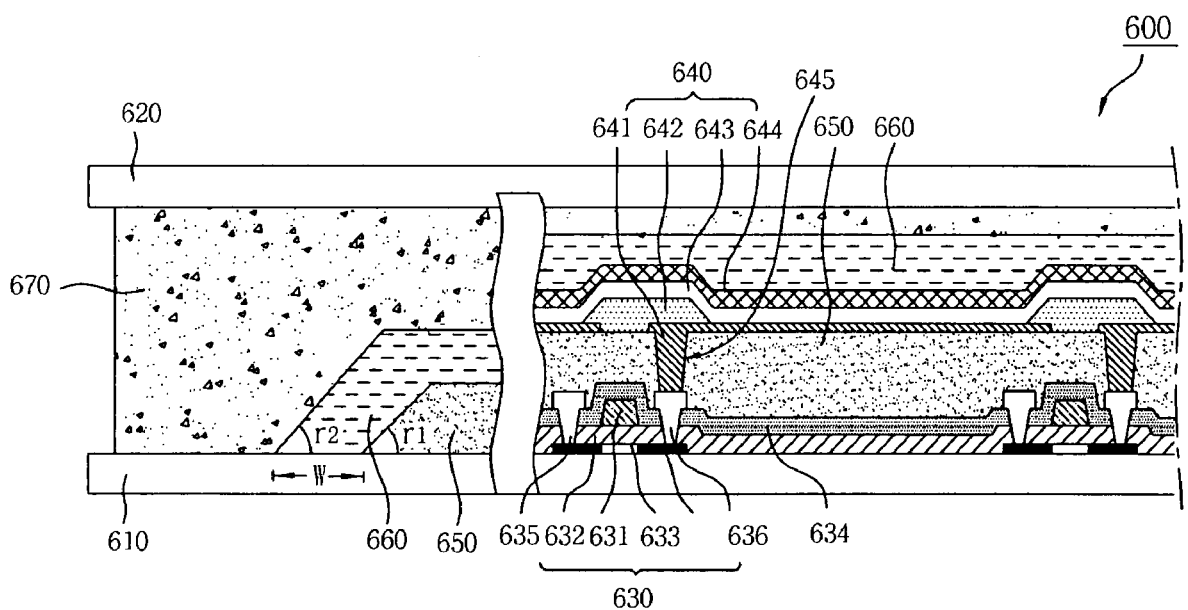
FIG. 6 illustrates an organic light emitting display according to a fourth embodiment.

FIG. 6 illustrates an organic light emitting display according to a fourth embodiment.

Referring to FIG. 6, in an organic light emitting display 600, a thin film transistor 630 and an emission unit 640 are positioned on a substrate 610.

The thin film transistor 630 including a semiconductor layer 633, a gate dielectric layer 632, a gate electrode 631, an interlayer dielectric layer 634, a source electrode 635, and a drain electrode 636 is positioned on the substrate 610.

A planarization layer 650 is positioned on the substrate 610. An edge portion of the planarization layer 650 is formed to be inclined inwardly. In other words, the planarization layer 650 includes a normal tapered edge portion. A taper angle r1 of the edge portion of the planarization layer 650 may range from 15° to 60°.

A contact hole 645 is positioned inside the planarization layer 650 to expose a portion of the drain electrode 636. The emission unit 640 is positioned on the planarization layer 650.

The emission unit 640 includes a first electrode 641 electrically connected to the drain electrode 636 through the contact hole 645, a bank layer 642 exposing a portion of the first electrode 641, an organic emitting layer 643 positioned on the exposed portion of the first electrode 641, and a second electrode 644.

A passivation layer 660 is positioned on the substrate 610 to cover the emission unit 640 and the planarization layer 650. Since the planarization layer 650 is formed of an organic material, outside moisture and oxygen are likely to easily penetrate into the organic light emitting display 600 through an interface between the planarization layer 650 and the substrate 610. Therefore, the passivation layer 660 is formed to cover an edge portion of the planarization layer 650 so that the planarization layer 650 is not exposed.

The passivation layer 660 may comprise silicon nitride, silicon oxide, or multiple layers including silicon nitride and/or silicon oxide. The passivation layer 560 may be formed using sputtering or CVD.

An edge portion of the passivation layer 660 is formed to be inclined inwardly. In other words, the passivation layer 660 includes a normal tapered edge portion. A taper angle r2 of the edge portion of the passivation layer 660 may range from 15° to 60°. The taper angle r2 of the edge portion of the passivation layer 660 may be substantially equal to the taper angle r1 of the edge portion of the planarization layer 650.

When the taper angles r1 and r2 ranges from 15° to 60°, the passivation layer 660 having an uniform thickness is formed on the planarization layer 650 due to good step coverage characteristics of the passivation layer 660. Further, since the planarization layer 650 and the passivation layer 660 are formed to be inclined, adhesion between the passivation layer 660 and the planarization layer 650 improves due to an increase in an adhesion area between the passivation layer 660 and the planarization layer 650. Accordingly, when the taper angles r2 of the passivation layer 660 is be substantially equal to the taper angle r1 of the planarization layer 650, an interception effect of moisture and oxygen penetrating from the outside is maximized.

A length W ranging from the edge of the planarization layer 650 to an edge of the passivation layer 660 may range from 50 μm to 500 μm. When the length W is equal to or more than 50 μm, the penetration of outside moisture and oxygen is prevented efficiently. When the length W is equal to or less than 500 μm, the passivation layer 660 are formed in bonding portions of interconnections connected to a driver for supplying a driving signal from the outside and the thin film transistor 630 such that a failure in the signal supply is prevented.

A cover substrate 620 is attached to the substrate 610 on which the passivation layer 660 is positioned. The cover substrate 620 may be a transparent substrate, and include transparent glass or plastic.

A sealant 670 is positioned in a space between the substrate 610 and the cover substrate 620. The sealant 670 may be formed to cover the passivation layer 660. In other words, the sealant 670 is a face sealant applied to a front surface of the cover substrate 620. The space between the substrate 610 and the cover substrate 620 is filled with the sealant 670 by attaching the cover substrate 620, to which the sealant 670 is applied, to the substrate 610.

The face sealant 670 prevents line fail caused by applying pressure to the emission unit 440 due to an external impact. Since an internal space of the organic light emitting display 600 is filled with the face sealant 670, the penetration of outside moisture and oxygen into the emission unit 640 is prevented efficiently.

Although not shown, an edge portion of the face sealant 670 may be formed to be inclined inwardly. In other words, the face sealant 670 may include a normal tapered edge portion. A taper angle of the edge portion of the face sealant 670 may be substantially equal to the taper angles r1 and r2 of the planarization layer 650 and the passivation layer 660. When the edge portion of the face sealant 670 is formed to be inclined, adhesion between the face sealant 670 and the passivation layer 660 improves such that the penetration of outside moisture and oxygen into the organic light emitting display 600 is prevented efficiently.

As above, the organic light emitting display 600 according to the fourth embodiment includes the passivation layer 660 covering the edge portion of the planarization layer 650, and the face sealant 670 covering the edge portion of the passivation layer 660. Therefore, the penetration of outside moisture and oxygen into the organic light emitting display 600 through the interface between the planarization layer 650 including the organic material and the substrate 610 is prevented doubly, thereby preventing the deterioration of the organic light emitting display 600 and increasing life span of the organic light emitting display 600.

Since the planarization layer 650 and the passivation layer 660 are formed to be inclined, adhesion between the passivation layer 660 and the planarization layer 650 improves such that the penetration of outside moisture and oxygen into the organic light emitting display 600 is prevented efficiently.

Further, the organic light emitting display 600 with strong durability and improved image quality is provided in the fourth embodiment.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. An organic light emitting display comprising:
a substrate;
a thin film transistor positioned on the substrate;
a planarization layer positioned on the thin film transistor;
an emission unit positioned on the planarization layer and electrically connected to the thin film transistor;
a passivation layer positioned on the substrate to cover the thin film transistor, the emission unit and an edge portion of the planarization layer; and
a cover substrate attached to the substrate, wherein the substrate is attached to the cover substrate with a sealant, wherein the sealant is positioned in a space between the substrate and the cover substrate to cover an edge portion of the passivation layer, and
wherein the planarization layer, the passivation layer, and the sealant each have a normal taper edge portion, and taper angles of the edge portions of the planarization layer, the passivation layer, and the sealant range from 15° to 60°, respectively.

2. The organic light emitting display of claim 1, wherein a length ranging from an edge of the planarization layer to an edge of the passivation layer ranges from 50 μm to 500 μm.

3. The organic light emitting display of claim 1, wherein the planarization layer and the passivation layer each have a normal taper edge portion, and taper angles of the edge portions of the planarization layer and the passivation layer range from 15° to 60°, respectively.

4. The organic light emitting display of claim 3, wherein the taper angle of the edge portion of the planarization layer is substantially equal to the taper angle of the edge portion of the passivation layer.

5. The organic light emitting display of claim 1, wherein the sealant is positioned in the portions of the substrate and the cover substrate, and is spaced from the passivation layer.

6. The organic light emitting display of claim 1, wherein the taper angles of the edge portions of the planarization layer, the passivation layer, and the sealant are substantially equal to one another.

7. The organic light emitting display of claim 1, wherein the cover substrate is a transparent substrate comprising glass or plastic.

8. The organic light emitting display of claim 1, wherein the emission unit comprises a first electrode, an organic emitting layer, and a second electrode.

9. The organic light emitting display of claim 8, wherein the first electrode is a cathode, and comprises a metal having a low work function.

10. The organic light emitting display of claim 9, wherein the second electrode is an anode, and comprises a transparent conductive oxide layer having a high work function.

11. The organic light emitting display of claim 8, wherein the first electrode is an anode, and comprises a reflective metal layer and a transparent conductive oxide layer having a high work function.

12. The organic light emitting display of claim 11, wherein the transparent conductive oxide layer comprises one selected from a group consisting of ITO, IZO, ICO and ZnO.

13. The organic light emitting display of claim 11, wherein the second electrode is a cathode, and a transflective electrode having a low work function.

14. The organic light emitting display of claim 13, wherein the transflective electrode comprises one selected from a group consisting of Mg, Ag, Al, Ca or alloy thereof.

15. The organic light emitting display of claim 1, wherein the planarization layer comprises one of a polyacryl-based resin, a polyimide-based resin, and a benzocyclobutene (BCB)-based resin.

16. The organic light emitting display of claim 1, wherein the passivation layer comprises a silicon oxide layer or a silicon nitride layer.

* * * * *